(12) United States Patent
Oketani et al.

(10) Patent No.: US 7,334,721 B2
(45) Date of Patent: Feb. 26, 2008

(54) SHEET-CUTTING APPARATUS (75) Inventors: Tetsuya Oketani, Gifu (JP); Mitsutaka Hori, Obu (JP)

(73) Assignees: Howa Machinery, Ltd., Aichi (JP); Hori Corporation, Nagoya-Shi (JP)

( * ) Notice: Subject to any disclaimer, the term of this patent is extended or adjusted under 35 U.S.C. 154(b) by 364 days.

(21) Appl. No.: 10/505,765

(22) PCT Filed: Dec. 12, 2003

(86) PCT No.: PCT/JP03/15987

§ 371 (c)(1),
(2), (4) Date: Aug. 26, 2004

(87) PCT Pub. No.: WO2004/060619

PCT Pub. Date: Jul. 22, 2004

(65) Prior Publication Data

US 2005/0229767 A1    Oct. 20, 2005

(30) Foreign Application Priority Data

Dec. 27, 2002  (JP) .............................. 2002-381472

(51) Int. Cl.
*B26D 5/00*   (2006.01)
(52) U.S. Cl. ........................................ 234/117; 83/549
(58) Field of Classification Search ................ 234/117; 83/549–552
See application file for complete search history.

(56) References Cited

U.S. PATENT DOCUMENTS

| | | | |
|---|---|---|---|
| 3,699,596 A * | 10/1972 | Lyon ......................... | 412/13 |
| 4,250,784 A | 2/1981 | Bredow | |
| 4,998,958 A * | 3/1991 | Chun et al. ................... | 83/133 |
| 5,211,095 A * | 5/1993 | Chun et al. ................... | 83/552 |
| 5,382,102 A * | 1/1995 | Brolund et al. ............. | 400/134 |
| 6,344,018 B1 * | 2/2002 | Aizawa ....................... | 483/29 |

FOREIGN PATENT DOCUMENTS

| | | |
|---|---|---|
| DE | 27 52 912 | 5/1979 |
| EP | 0 450 363 A1 | 10/1991 |
| EP | 0 450 363 B1 | 10/1991 |
| JP | 1-122408 | 5/1989 |
| JP | 2001-18179 | 1/2001 |
| JP | 2001-113520 | 4/2001 |
| JP | 2001-179553 | 7/2001 |

* cited by examiner

*Primary Examiner*—Kenneth E. Peterson
(74) *Attorney, Agent, or Firm*—Finnegan, Henderson, Farabow, Garrett & Dunner, L.L.P.

(57) ABSTRACT

A sheet cutter for cutting a sheet with a cutting blade held by a cutting blade elevating body which is elevated by one servo motor, including a pair of cutting blade elevating bodies; an elevation driving body for elevating the pair of cutting blade elevating bodies; a guide member for guiding the elevation of the pair of cutting blade elevating bodies; a holding body capable of holding the pair of cutting blade elevating bodies at an up position; and a transmission change-over device for selectively engaging the pair of cutting blade elevating bodies with the elevation driving body and selectively disengaging the pair of cutting blade elevating bodies from the elevation driving body, wherein one of the pair of cutting blade elevating bodies, which has been selected, is elevated by the servo motor.

2 Claims, 7 Drawing Sheets

SHEET-CUTTING APPARATUS

TECHNICAL FIELD

The present invention relates to a sheet cutter for conducting complete-cutting or half-cutting (cutting a sheet while leaving a portion of predetermined thickness of the sheet) on a soft sheet such as a ceramic green sheet. More particularly, the present invention relates a sheet cutter provided with two or more cutting blades.

BACKGROUND ART

Concerning a conventional sheet cutter for cutting a soft sheet such as a ceramic green sheet, for example, sheet cutters which are disclosed in the official gazettes of Japanese Unexamined Patent Publication Nos. 2001-113520 and 1-122408 are known. Japanese Unexamined Patent Publication No. 2001-113520 discloses a sheet cutter having the following cutting blade attaching structure. The sheet cutter has one cutting blade which is elevated by one drive section. A cutting blade holder (cutting blade elevating body) to which the cutting blade is attached is fixed to a lower end portion of the guide rod, which is elevatably provided in the frame, in such a manner that the cutting blade holder protrudes downward, and an elevating drive section is connected to a center on an upper face of the cutting blade holder.

Japanese Unexamined Patent Publication No. 1-122408 discloses a sheet cutter having the following cutting blade attaching structure. A base table is provided on a movable table elevated by a feed screw, and a horn (cutting blade elevating body) is attached to the base table in such a manner the horn protrudes downward and one cutting blade is attached to the horn.

As described above, as one cutting blade is elevated by one drive section in the cutter described in Japanese Unexamined Patent Publication No. 2001-113520, in the case where a pair of cutting blade elevating bodies are provided, it is necessary to provide a pair of guide rods and it is also necessary to provide a pair of drive sections. Accordingly, problems may be caused in which the structure of the cutting blade elevating section becomes complicated and the size of the cutting blade elevating section is extended.

In addition, as a pair of guide rods are elevatably arranged in the frame and the cutting blade elevating body is attached to a lower end portion of the guide rod in such a manner that the cutting blade elevating body protrudes downward, the cutting blade elevating body is liable to be deformed or tilted. Therefore, the cutting accuracy of the sheet cutter is lowered.

In the case of Japanese Unexamined Patent Publication No. 1-122408, the following problems may be encountered. The base table is arranged on the movable table elevated by the feed screw, and the horn is attached to the base table in such a manner that the horn protrudes downward. Thus, in the case where a pair of cutting blades are provided, it is necessary to have a pair of feed screws and it is also necessary to have a pair of movable tables. Therefore, the structure becomes complicated and the size of the sheet cutter is extended. Further, the horn to hold the cutting blade is liable to be tilted. Accordingly, the cutting accuracy is lowered.

The present invention has been accomplished to solve the above problems of the prior art. It is an object of the present invention to provide a sheet cutter in which the cutting blade elevating section is downsized; the cutting accuracy is high; and the cutting speed is increased, even if the sheet cutter cuts a sheet, so as to have different cutting lengths, with two cutting blades.

DISCLOSURE OF THE INVENTION

In order to solve the above problems, in the first embodiment, a sheet cutter for cutting sheet with a cutting blade held by a cutting blade elevating body which is elevated being driven by one servo motor, comprises: a pair of cutting blade elevating bodies; an elevation driving body for elevating the pair of cutting blade elevating bodies; a guide member for guiding the elevation of the pair of cutting blade elevating bodies; a holding body capable of holding the pair of cutting blade elevating bodies at a up position; and a transmission change-over device for selectively engaging the pair of cutting blade elevating bodies with the elevation driving body and selectively disengaging the pair of cutting blade elevating bodies from the elevation driving body, wherein one of the pair of cutting blade elevating bodies, which has been selected, is elevated by the servo motor.

According to the above constitution, a pair of cutting blade elevating bodies are selectively elevated by the transmission change-over device. Therefore, even in the case of a sheet cutter in which a sheet can be cut into a different cutting length with two cutting blades, for example, a sheet can be cut into a rectangle when the sheet cutter is operated being combined with a turn table, the pair of cutting blade elevating bodies can be arranged close to each other and the device can be downsized, and further the sheet cutter can be sufficiently operated by only one cutting blade elevating device. Therefore, the structure can be made simple. As the elevating motion of the cutting blade elevating body is guided by the guide member, the deformation and inclination of the cutting blade can be reduced.

According to the second embodiment, in the sheet cutter according to the first embodiment, through-holes communicating with each other in the horizontal direction at a up position of the cutting blade elevating body are formed in both the elevation driving body and the pair of cutting blade elevating bodies, and a transmission change-over device is composed which includes a connecting pin inserted into the through-holes and also includes a pin change-over moving device for selectively moving the connecting pin between a position where the connecting pin is inserted into the through-hole of the elevation driving body and into the through-hole of one of the cutting blade elevating bodies in a bridge-like state and other position where the connecting pin is inserted into the through-holes of the elevation driving body and not inserted into the through-holes of one of the cutting blade elevating bodies in a non-bridge-like state. Due to the above constitution, the cutting blade elevating body to be elevated can be accurately and positively changed over.

According to the third embodiment, in the first embodiment, a pair of horizontal through-holes are formed in the elevation driving body, a holding member is stationarily provided on one side of the through-hole direction of the elevation driving body at a up position, one of the cutting blade elevating bodies is partially inserted between the holding member and the elevation driving body, the holding member is stationarily provided on the other side in the through-hole direction of the elevation driving body, the other cutting blade elevating body is partially inserted between the holding member and the elevation driving body, the through-hole opposed to one of the through-holes formed in the elevation driving body is respectively provided in the holding member and the cutting blade elevating body on one side, the through-hole opposed to the other through-hole formed in the elevation driving body is respectively formed in the holding member and the cutting blade elevating body on the other side, and a transmission change-over device is composed which includes a pair of connecting pins inserted into two sets of through-holes opposed to each other and also includes a pin change-over moving device capable of being selectively moved between a position, at which one of the connecting pins functions as a bridge between the through-holes of the elevation driving body and the cutting blade elevating body and further the other connecting pin is disengaged from the elevation driving body and functions as a bridge between the through-holes of the holding body and the cutting blade elevating body, and a position at which one of the connecting pins is disengaged from the elevation driving body and functions as a bridge between the through-holes of the holding member and the cutting blade elevating body and the other connecting pin functions as a bridge between the through-holes of the elevation driving body and the cutting blade elevating body. Due to the above constitution, a connection of the elevation driving body with the pair of cutting blade elevating bodies can be accurately and positively executed by a simple structure.

According to the fourth embodiment, in the second or the third embodiment, a pushing pawl capable of pushing upward one of the cutting blade elevating body and the elevation driving body under the condition that both are connected to each other is provided in the other, and a contacting member capable of releasing the pushing action by the pushing pawl at a up position of the elevation driving body is provided. Due to the above structure, it is possible to eliminate a gap in the vertical direction between the cutting blade elevating body and the elevation driving body under the connecting condition. Therefore, it is possible to highly accurately position a lower position of the cutting blade elevating body. Accordingly, half-cutting can be highly accurately conducted on a sheet. Further, a change-over can be smoothly conducted between the connection with the cutting blade elevating body and the connection with the elevation driving body.

According to the fifth embodiment, in one of the first to the fourth embodiment, the guide member includes a pair of guide rails arranged at the right and left end portions of the cutting blade elevating body in parallel to the cutting blade elevating direction and also includes a pair of guide pieces vertically arranged in the corresponding sheet cutter frame, and the guide rail can be slidably moved on the guide piece. Due to the above structure, both the distance between the cutting blade and the guide member in the vertical direction and the distance between the cutting blade and the guide member in the horizontal direction can be reduced, and the deformation and inclination of the cutting blade can be decreased. Therefore, the cutting blade elevating body can be smoothly elevated at high speed while its posture is being stably maintained. Accordingly, cutting operation can be conducted at high speed while the cutting accuracy is being maintained high.

BRIEF DESCRIPTION OF THE DRAWINGS

FIG. 1 is a schematic illustration showing an embodiment of the sheet cutter of the present invention, that is.

MOST PREFERRED EMBODIMENT

Figure 1:
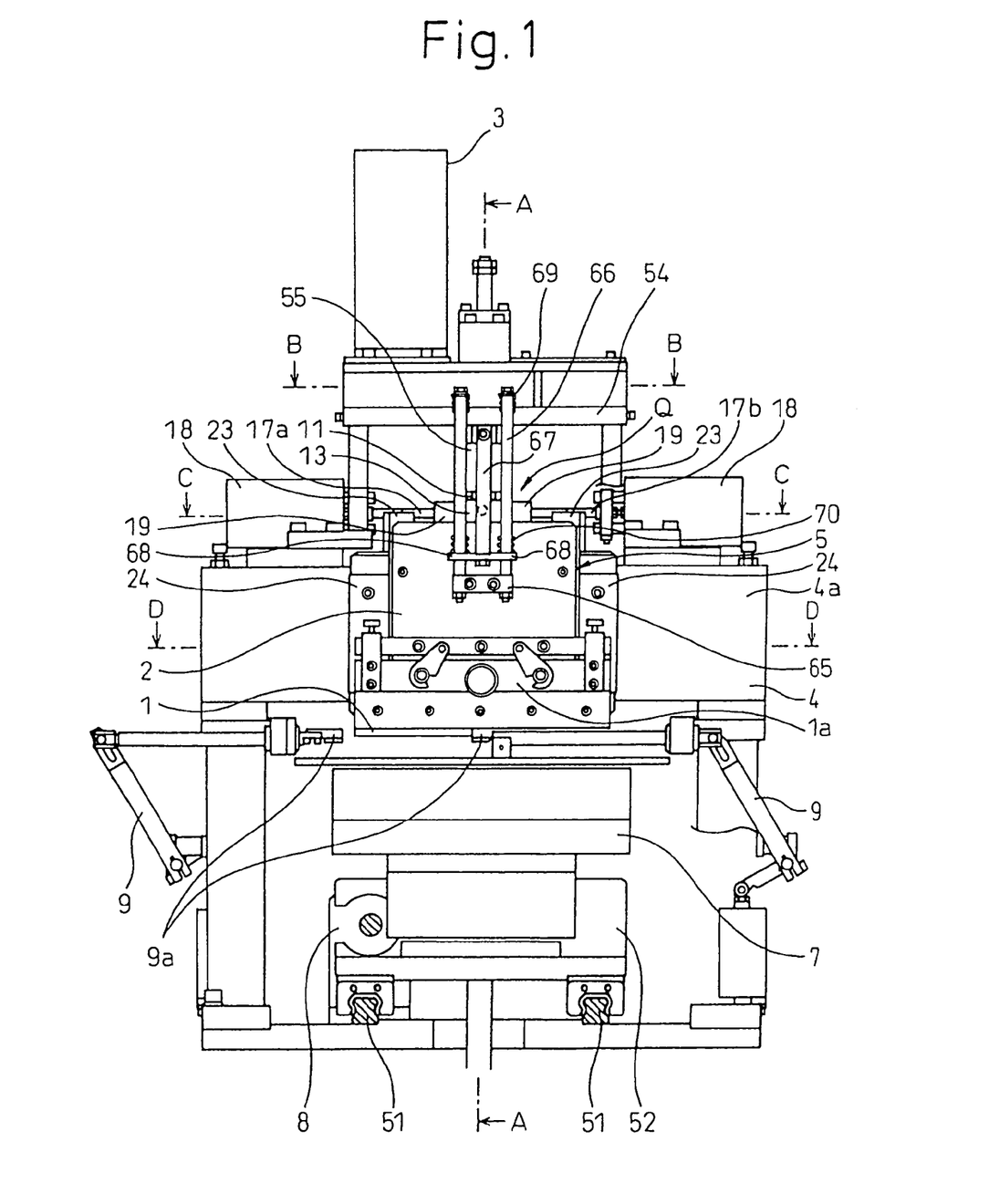
FIG. 1 is a schematic illustration showing a cutting blade elevating section which is a primary portion of the sheet cutter of the present invention.
Figure 2:
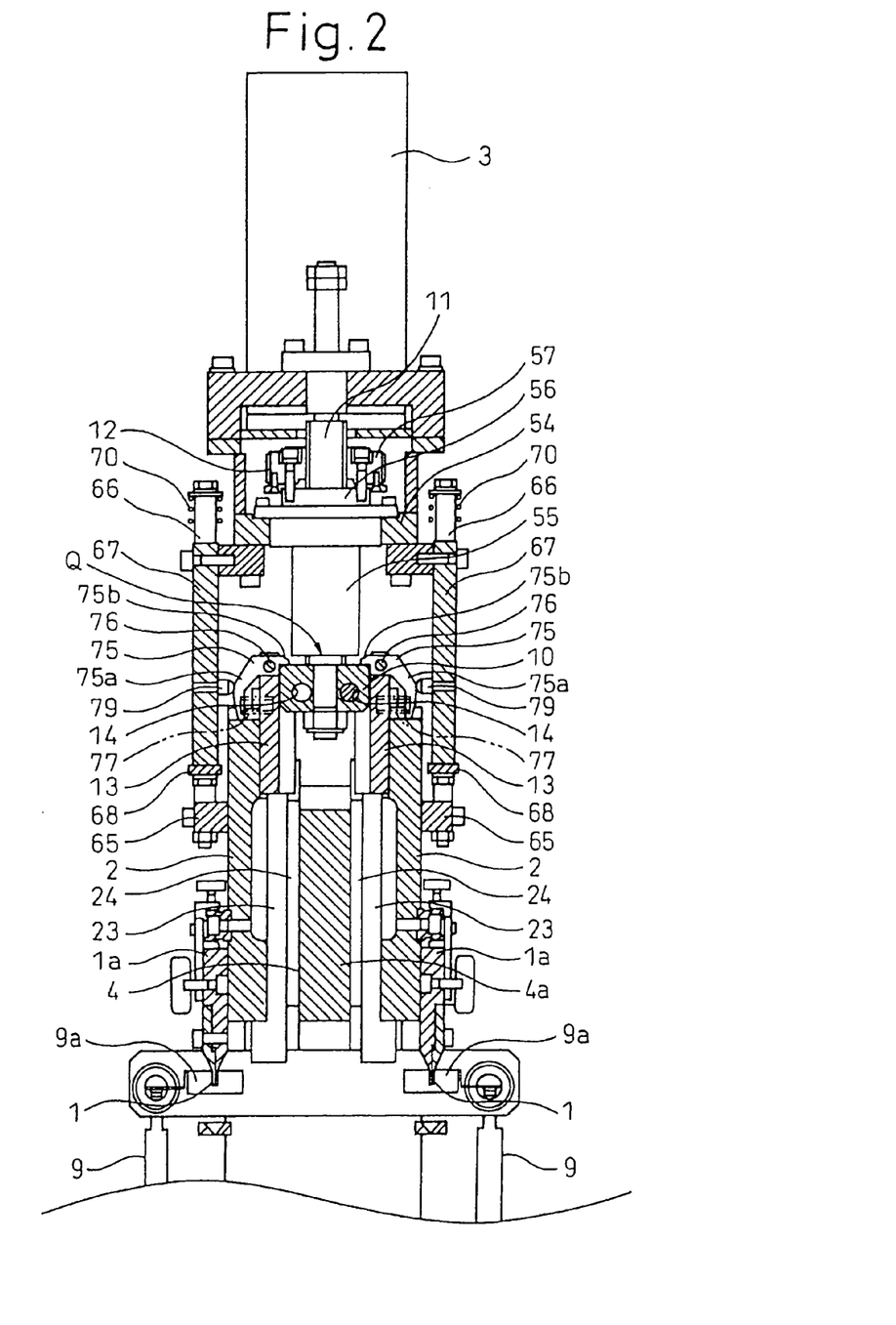
FIG. 2 is a sectional schematic illustration taken on line A-A in FIG. 1.
Figure 3:
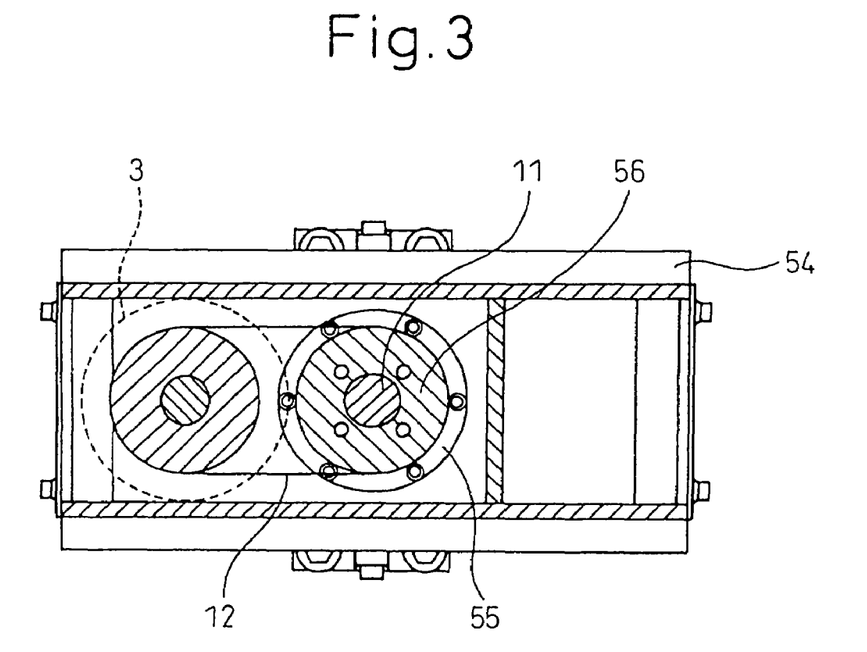
FIG. 3 is a sectional schematic illustration taken on line B-B in FIG. 1.
Figure 4:
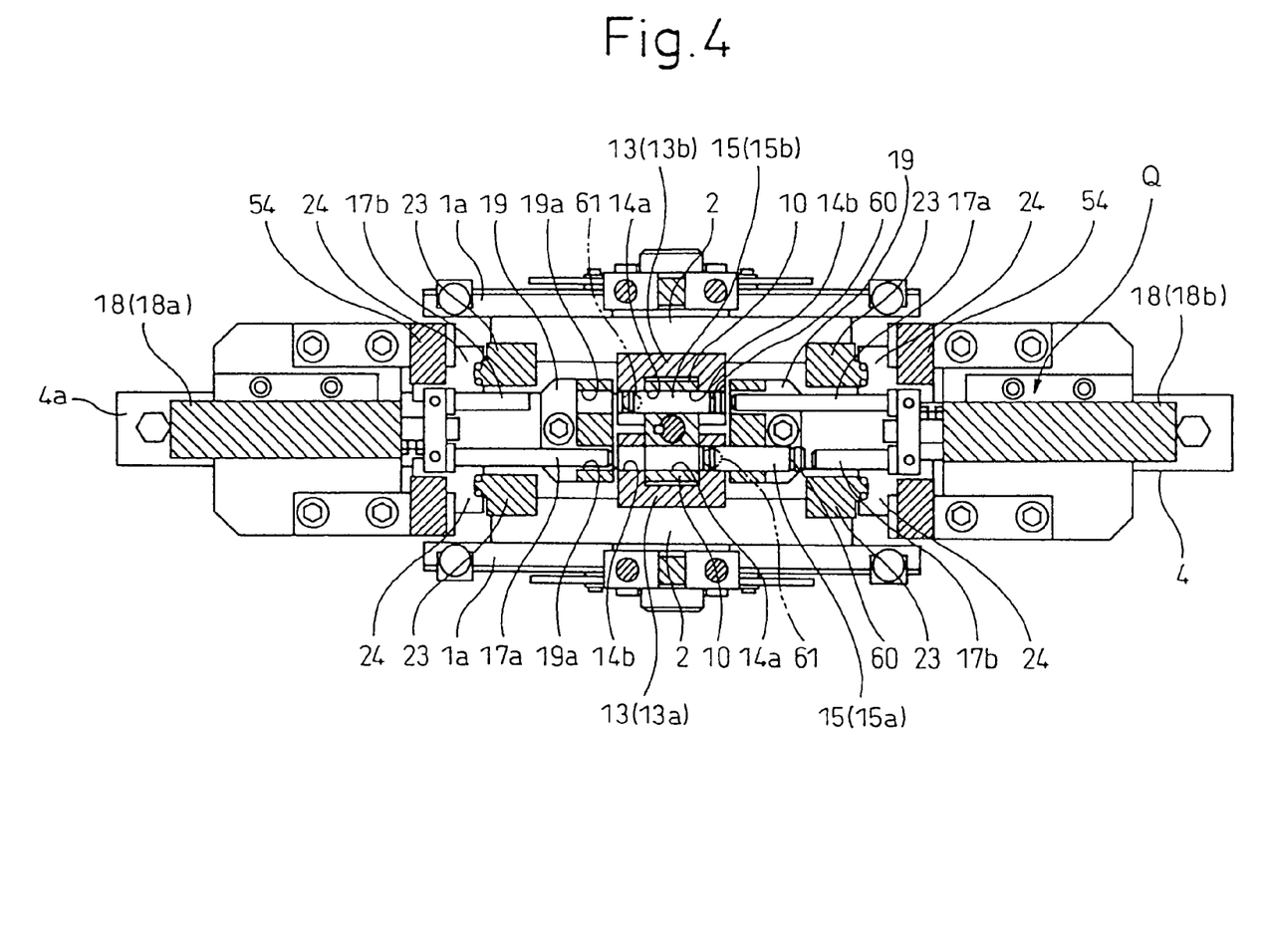
FIG. 4 is a sectional schematic illustration taken on line C-C in FIG. 1.
Figure 5:
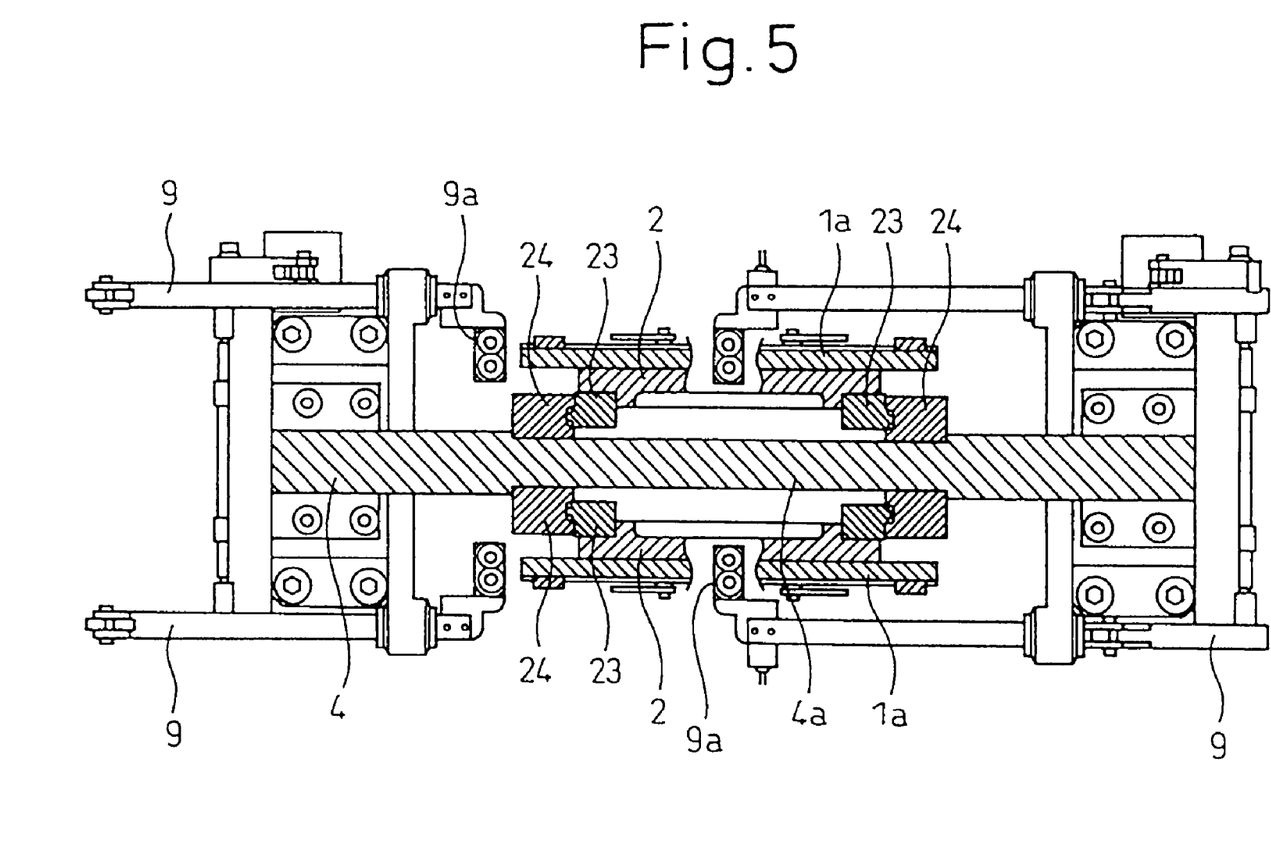
FIG. 5 is a sectional schematic illustration taken on line D-D in FIG. 1.

Referring to the accompanying drawings, an embodiment of the present invention will be explained below in detail. FIGS. 1 to 5 are views showing an embodiment of the sheet cutter of the present invention, that is, FIGS. 1 to 5 are schematic illustrations showing a cutting blade elevating section which is a portion of the sheet cutter. FIG. 1 is a front view, FIG. 2 is a sectional view taken on line A-A, FIG. 3 is a sectional view taken on line B-B, FIG. 4 is a sectional view taken on line C-C, and FIG. 5 is a sectional view taken on line D-D. In FIG. 1, reference numeral 1 is a cutting blade, and reference numeral 2 is a cutting blade elevating body. The cutting blade 1 is exchangeably attached to the cutting blade fixture 1a which is removably attached to the cutting blade elevating body 2. Reference numeral 3 is a servo motor for elevating the cutting blade elevating body 2, and reference numeral 4 is a frame of the sheet cutter.

In this connection, reference numeral 7 is a work setting base on which a work to be cut is set. The work setting base 7 is arranged on the movable base 52, which is guided by the guide rail 51 so that it can be moved forward, and is capable of revolving by the angle of 90°. Reference numeral 8 is a motor for moving the movable base 52 in the back-and-forth direction. Reference numeral 9 is a cleaning utensil moving device for moving a cleaning utensil 9a used for cleaning the cutting blade 1.

As shown in FIGS. 2 and 5, a pair of cutting blade elevating bodies 2 are provided in such a manner that the plate-shaped frame 4a, which is vertically arranged at the center, is interposed between the pair of cutting blade elevating bodies 2. At the central upper portion of the pair of cutting blade elevating bodies 2, 2, one elevation driving body 10 is arranged in such a manner that the elevation driving body 10 can be elevated by the screw shaft 11. The cutting blade elevating bodies 2 are selectively engaged with and disengaged from the elevation driving body 10 by a transmission change-over device Q described later. Therefore, one of the cutting blade elevating bodies 2 is connected to the screw shaft 11 via the elevation driving body 10. As shown in FIGS. 1 to 3, the feed screw shaft 11 is screwed to the nut 56 which is pivotally supported by the holding body 55 fixed to the support shaft 54 integrated with the frame 4. This nut 56 is normally rotated and reversed by the servo motor 3, which is arranged at an upper portion of the frame 4, via the belt 12 and the pulley 57. As a result of the rotation of the nut 56, the cutting blade elevating body 2 connected to the elevation driving body 10 is elevated when the cutting blade elevating body 2 is driven by the servo motor 3. In this connection, the other cutting blade elevating body 2 not connected to the elevation driving body 10 is stationarily fixed to a up position meanwhile by the holding member described later. It is also possible to rotate the feed screw 11 by the servo motor 3 and elevate the elevation driving body 10 by the nut 56.

Next, explanations will be made regarding the transmission change-over device Q which selectively engages the pair of cutting blade elevating bodies 2 with the elevation driving body 10 and also selectively disengages the pair of cutting blade elevating bodies 2 from the elevation driving body 10. As shown in FIG. 4, the elevation driving body 10 is connected to a lower portion of the feed screw shaft 11. In an upper portion of the pair of cutting blade elevating body 2, the engaging pieces 13 respectively engaging with the elevation driving body 10 are arranged and formed into a U-shape in such a manner that the engaging pieces 13 surround an end portion of the elevation driving body 10. The engaging pieces 13 may be formed and integrated with the cutting blade elevating body 2. Alternatively, as shown in the drawing, the engaging pieces 13 may be formed separate from the cutting blade elevating body 2 and fixed to the cutting blade elevating body 2. These engaging pieces 13 are composed in such a manner that the engaging pieces 13a of the front side cutting blade elevating body 2 and the engaging pieces 13b of the rear side cutting blade elevating body 2 are arranged in the front and the rear of the elevation driving body 10 and opposed to each other.

In the right and left end portions of the engaging pieces 13a, 13b surrounding the elevation driving body 10, the through-holes 14a, 14a are formed in the side to side direction in such a manner that the through-holes 14a, 14a respectively penetrate the elevation driving body 10. In the same manner, in the elevation driving body 10, two through-holes 14b, 14b are respectively formed which are opposed to the through-holes 14a, 14a of the engaging pieces 13a, 13b at a predetermined up position. The connecting pins 15 capable of being inserted into the through-holes 14b, 14b of the elevation driving body 10 are respectively inserted into the through-holes 14a, 14a of the engaging pieces 13a, 13b. The annular engaging grooves 60 used for positioning are formed in both end portions of the connecting pins 15. These annular engaging grooves 60 are engaged with the notch pins 61 embedded in the engaging pieces 13a so as to be positioned, that is, so as to prevent the connecting pins 15 from coming out.

As shown in FIG. 4, in an upper portion of the frame 4 located on the right and left of the cutting blade elevating body 2, the cylinders 18, 18 are arranged with piston rods which extend and retract in the lateral direction being opposed to each other, and have guide rods. The rod-shaped push-out pins 17a and the push-in pins 17b are arranged at the forward end portions of the piston rods in such a manner that the push-out pins 17a and the push-in pins 17b are alternately opposed to each other. The push-out pins 17a and the push-in pins 17b are arranged so that they have the same axes as the through-holes 14a of the engaging pieces 13, 13 at the up position of the cutting blade elevating body 2. The push-out pins 17a and the push-in pins 17b are formed in such a manner that the diameters of these pins are smaller than the diameters of the connecting pins 15.

A pair of holding means 19 are provided between the cylinders 18, 18 and the engaging pieces 13, 13. A pair of front and rear through-holes 19a, 19a, into which the push-out pins 17a, the push-in pins 17b and the connecting pins 15 can be inserted, are formed in the holding means 19. As shown in FIG. 1, the pair of holding members 19 are fixed onto the frame 4. In this connection, the cylinder 18 is operated by pneumatic pressure, however, the cylinder 18 may be operated by an electric motor. Both cylinders 18, 18 are composed as follows. The push-out pins 17a are longer than the push-in pins 17b. The push-in pins 17b are arranged being opposed to the push-out pins 17a. When the piston rod is protruded, the push-out pins 17a push out the connecting pins 15 from the through-holes 14b of the elevation driving body 10. Therefore, the push-in pins 17b push in the connecting pins 15 to positions where the connecting pins 15 act as a bridge between the through-holes 14b of the elevation driving body 10 and the through-holes 14a of the engaging pieces 13.

Transmission change-over device Q includes the engaging pieces 13 of the elevation driving body 10, the connecting pins 15, the push-out pins 17a, the push-in pins 17b and the holding member 19 which are composed as described above. This transmission change-over device Q is operated as follows. When one of the cylinders 18 is operated and the push-out pin 17a is protruded at the time of a rise of the cutting blade elevating body 2, the connecting pin 15 collides with the push-out pin 17a and is pushed out to the push-in pin 17b side opposed to the push-out pin 17a. Due to this movement, the engaging pieces 13 connected to the elevation driving body 10 by the connecting pins 15 are released from the elevation driving body 10 and engaged and connected with the holding body 19. This state is held by the engagement of the engaging grooves 60 with the notch pins 61. As a result, one cutting blade elevating body 2 including the engaging pieces 13 connected to the holding member 19 is not elevated and is reliably held in the fixed state at the up position.

The push-in pins 17b push in the connecting pins 15, which are inserted into the through-holes 19a of the holding member 19, in such a manner that the connecting pins 15 act as a bridge between the through-holes 14b of the elevation driving body 10 and the through-holes 14a of the engaging pieces 13. This state is held by the engagement of the engaging grooves 60 with the notch pins 61. Accordingly, the other cutting blade elevating body 2 is connected to the elevation driving body 10.

When the other cylinder 18 is operated in this state and the push-in pins 17b, which are arranged being opposed, are protruded, the connecting pins 15, which have been pushed out, are pushed back, and the engaging pieces 13 and the holding member 19 are released from each other, and the connecting pins 15 penetrate the elevation driving body 10. Therefore, the engaging pieces 13 are connected to the elevation driving body 10 again. The push-out pins 17a push out the connecting pins 15 from the through-holes 14b of the elevation driving body 10 and insert them into the through-holes 19a of the holding member 19. In this way, the device returns to the initial state. Therefore, one of the cutting blade elevating body 2 can be elevated, and the other cutting blade elevating body 2 is held without being elevated. As described above, the cylinder 18 provided with the push-out pins 17a and the push-in pins 17b compose the pin change-over device.

Next, as shown in FIGS. 1 and 2, in the vicinity of the center of the side on the front and rear of the cutting blade elevating body 2, the bracket 65 is fixed, and a pair of spring support rods 66, rising upward, are fixed to this bracket 65. As shown in FIG. 1, these spring support rods 66 penetrate the holes formed in the spring receiving member 68 which is arranged at a lower end portion of the support member 67 fixed to the support frame 54 hung downward. The compressive spring 70 is interposed between the spring receiving seat 69, which is provided in an upper end portion of the spring support rod 66, and the spring receiving member 68, and a spring force generated by the compressive spring 70 acts upward on the cutting blade elevating body 2 via the spring support rod 66. Accordingly, the weight of the cutting blade elevating body 2 can be balanced with the spring force of the compressive spring 70. Therefore, an elevation of the cutting blade elevating body 2 can be smoothly conducted by a low intensity of force generated by the rotation of the nut 56 at high speed.

As shown in FIG. 2, at upper end portions of the engaging pieces 13, the pushing pawls 75 capable of pushing an upper face of the elevation driving body 10 are attached round the axes 76 so that the pushing pawls 75 can be pivoted upward and downward. The pushing fixtures 77, which are comprised of springs and pushing pins, are interposed between the receiving pieces 75*a* on the lower end side of the pushing pawls 75 and the engaging pieces 13. By the spring forces of these pushing fixtures 77, the pushing pieces 75*b* on the upper end side come into contact with an upper face of the elevation driving body 10 and push the elevation driving body 10 downward. The receiving pieces 75*a* of the pushing pawls 75 come into contact with the contacting members 79, which are fixed at an intermediate portion of the support member 67 when the cutting blade elevating body 2 is moved to the up position. Therefore, the pushing fixtures 77 are rotated in the direction of compression, and the pushing pieces 75*b* on the upper end side are separated from an upper face of the elevation driving body 10, and a pushing action of the elevation driving body 10 is temporarily released. Accordingly, in the case where the cutting blade elevating body 2 is moved to the up position and a connection of the pair of cutting blade elevating bodies 2 with the elevation driving body 10 is changed over, the pushing motion of the pushing pawls 75 to push the elevation driving body 10 is released. Therefore, the connecting pins 15 can be smoothly changed over by a low intensity of force. In the case where the cutting blade elevating body 2 is elevated by the elevation of the elevation driving body 10, a gap (play) in the vertical direction in the connecting portion of the elevation driving body 10 with the cutting blade elevating body 2 is eliminated, so that a lowering position of the cutting blade elevating body 2 can be highly accurately positioned. As a result, half-cutting, in which a portion of a sheet corresponding to a predetermined thickness is left uncut, can be highly accurately and uniformly conducted.

In this connection, in FIG. 2, the pushing pawls 75 are provided in the cutting blade elevating body 2, however, the pushing pawls 75 may be provided in the elevation driving body 10 so that the pushing pawls 75 can push the cutting blade elevating body 2 upward. For example, the following structure may be employed. In FIG. 2, the elevation driving body 10 is formed in such a manner that the elevation driving body 10 is extended downward, and the frame 4*a* is cut away so as to ensure a space. Then, the pushing pawls 75 are attached to a lower end portion of the elevation driving body 10 in a direction being rotated by the angle 180°, and a portion of the cutting blade elevating body 2 is pushed upward by the pushing pieces 75*b* of the pushing pawls 75. That is, the above object can be accomplished in the following manner. The pushing pawls 75 are provided in one of the cutting blade elevating body 2 and the elevation driving body 10 so that the other can be pushed upward under the condition that both are connected to each other, and the contacting member is provided in the frame, by which the pushing action of the pushing pawls 75 can be released at the up position of the cutting blade elevating body 2 and the elevation driving body 10.

Referring to FIG. 4, the action of the cutting blade elevating section composed as described above will be explained below in more detail. In FIG. 4, the cutting blade elevating body 2 on the upper side in the drawing, that is, the cutting blade elevating body 2 on the rear side is connected to the elevation driving body 10 so that it can be elevated, the cutting blade elevating body 2 on the front side is held at a fixed position. Explanations will be made below with the reference numerals defined as follows. Reference numeral 13*a* denotes a front side engaging piece 13*a*, reference numeral 13*b* denotes a rear side engaging piece, reference numeral 15*a* denotes a front side connecting pin, reference numeral 15*b* denotes a rear side connecting pin, reference numeral 18*a* denotes a left cylinder, and reference numeral 18*b* denotes a right cylinder.

As the rear side engaging piece 13*b* is connected to the elevation driving body 10 by the rear side connecting pin 15*b*, the rear side engaging piece 13*b* is directly elevated by the feed screw shaft 11. On the other hand, the front side engaging piece 13*a* is connected to the holding member 19 by the front side connecting pin 15*a* and not connected to the elevation driving body 10. Therefore, the front side engaging piece 13*a* is fixed to the holding member 19 side, that is, the front side engaging piece 13*a* is fixed to the frame 4 side. Accordingly, the front side engaging piece 13*a* is not elevated.

In the above state, the change-over operation can be conducted as follows. When the push-out pin 17*a* of the right cylinder 18*b* is protruded, the rear side connecting pin 15*b* is moved, and the rear side engaging piece 13*b* is released from the elevation driving body 10 and the connecting pin 15*b* is connected to the left holding member 19. At the same time, when the push-out pin 17*b* of the right cylinder 18*b* is protruded, the front side connecting pin 15*a* is moved and the front side engaging piece 13*a* is released from the holding member 19 of the front side engaging piece 13*a*. Therefore, the front side connecting pin 15*a* is connected to the elevation driving body 10. In this way, it is possible to obtain a state in which the state shown in FIG. 4 is changed over. That is, it is possible to obtain a state in which the front side cutting blade elevating body 2 is elevated and the rear side cutting blade elevating body 2 is held at the fixed position.

As described above, a pair of cutting blade elevating bodies 2, 2 can be selectively elevated by transmission change-over device Q. Therefore, even in the case of a sheet cutter capable of cutting a sheet into a rectangle by using two cutting blades, when the sheet cutter is combined with a work setting base, which can be revolved, a pair of cutting blade elevating bodies can be arranged close to each other. Therefore, the device can be downsized. Further, the cutting blade can be easily exchanged, and only one servo motor is sufficient for elevating the cutting blade, that is, the structure of the sheet cutter can be made simple.

In the right and the left end portion of the cutting blade elevating body 2, the guide rails 23, which extend in the vertical direction in parallel to each other, are attached all over the length. To the frame 4 opposed to the guide rails 23, the long guide piece 24 composing a rectilinear motion guide device is fixed. As shown in FIGS. 4 and 5, the guide rails 23 are provided so that the cutting blade elevating body 2 can be slid being engaged with the guide pieces 24 when the cutting blade elevating body 2 is elevated. Therefore, the cutting blade elevating body 2 can be stably elevated.

As described above, the elevating motion of the cutting blade elevating body is guided on both sides of the cutting blade elevating body 2 by the guide members composed of the guide rails 23 and the guide pieces 24. Therefore, the distances between the cutting blade 1 and the guide member in the vertical and the horizontal directions can be reduced. Accordingly, it is possible to reduce a deformation and inclination of the cutting blade. Further, it becomes possible to conduct cutting operation with high accuracy at high speed. As the cutting blade elevating body is slid in the vertical direction being guided by the guide pieces 24, the cutting blade elevating body to be elevated can be accurately, positively changed over. Therefore, while the cutting accuracy is being maintained high, the cutting blade elevating body can be smoothly elevated at high speed.

Figure 6:
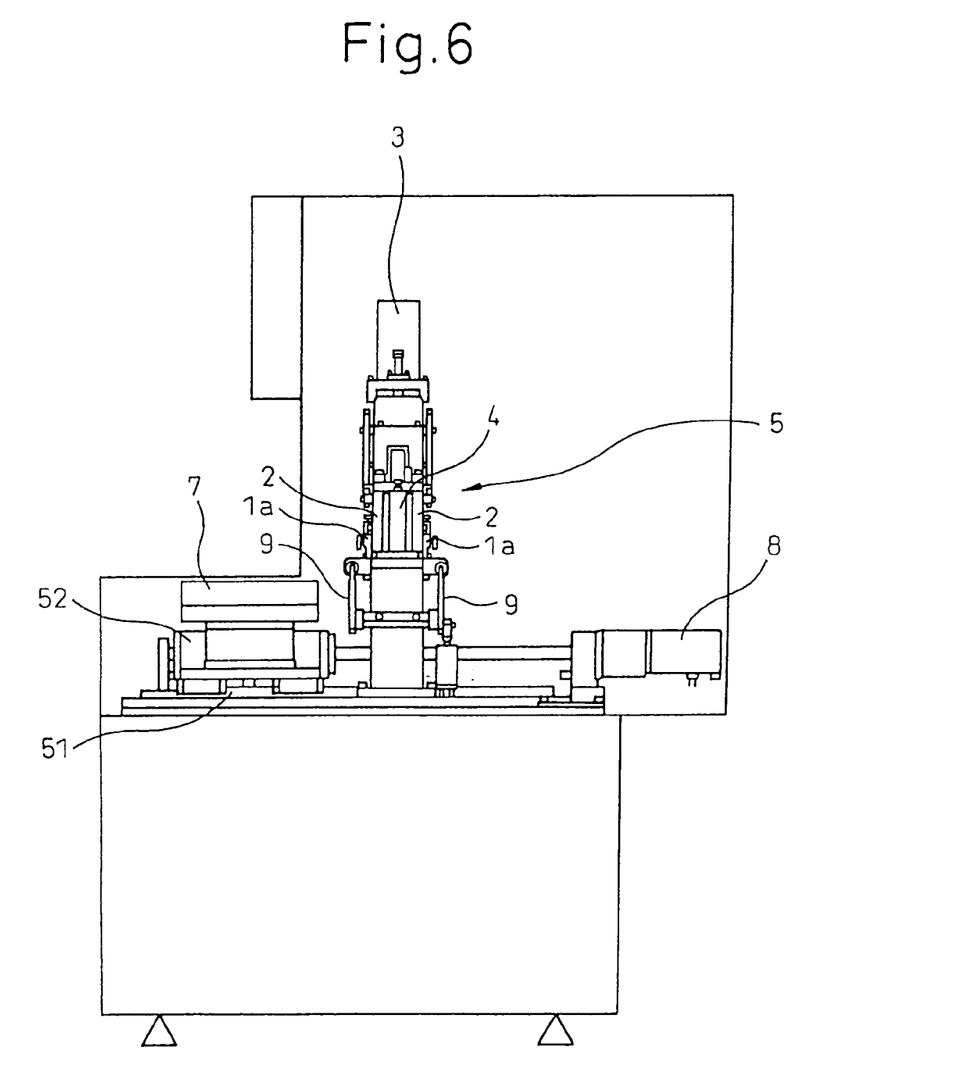
FIG. 6 is a front schematic illustration showing a sheet cutter provided with the cutting blade elevating section shown in FIG. 1.
Figure 7:
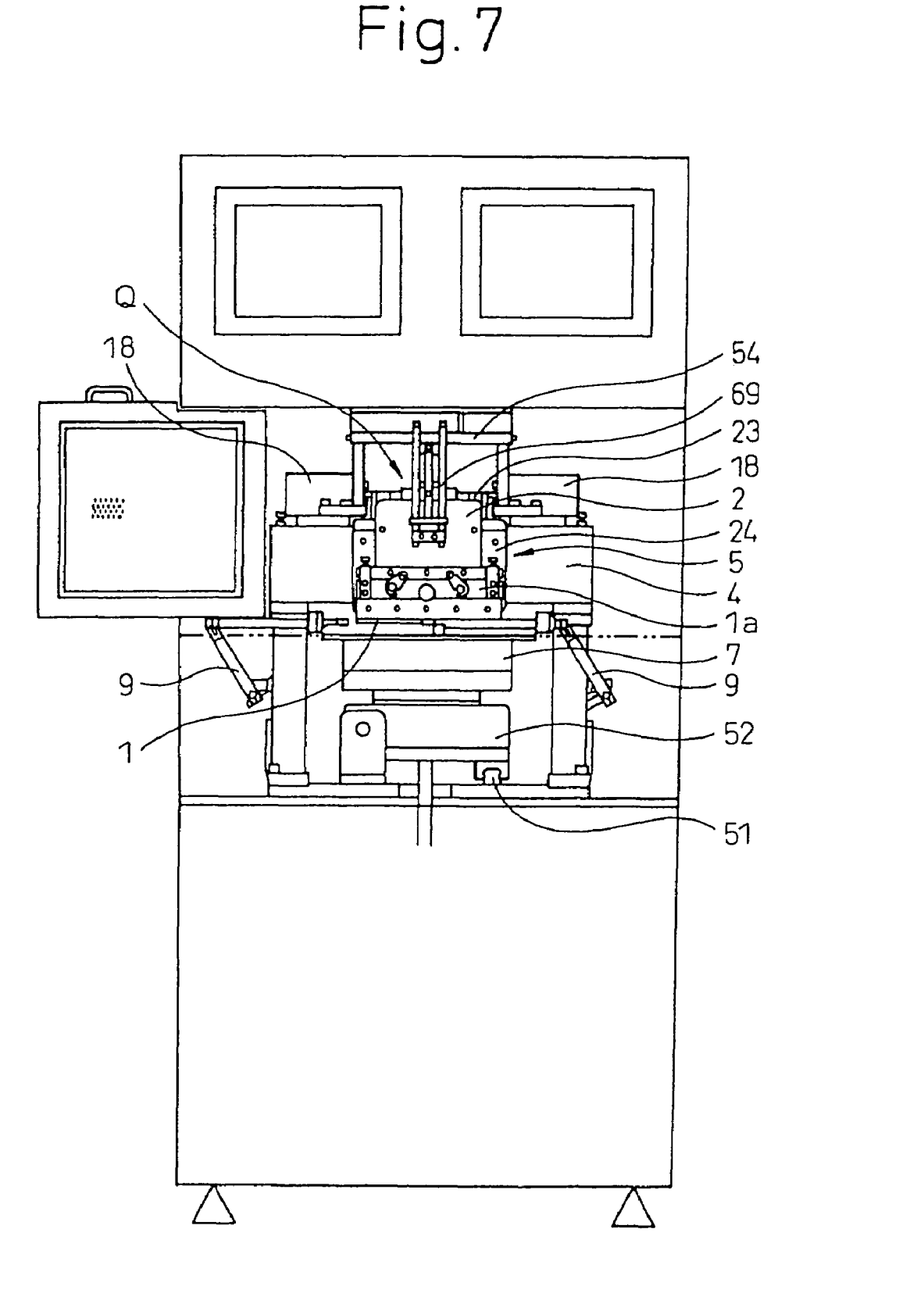
FIG. 7 is a schematic illustration showing the left face of FIG. 6.

FIGS. 6 and 7 are overall arrangement views of the sheet cutter provided with the above cutting blade elevating section. FIG. 6 is a front schematic illustration, and FIG. 7 is a schematic illustration showing the left face. Reference numeral 5 is a cutting blade elevating section. As shown in the drawing, the cutting blade elevating section 5 is located at the substantial center of the device. As shown in FIG. 6, the work setting base 7 is assembled to the moving base 52 which moves in the side to side direction and is capable of revolving through an angle of 90°.

As described above in detail, according to the present invention, a pair of cutting blade elevating bodies are selectively elevated by the transmission change-over device. Therefore, even in the case of a sheet cutter in which a sheet can be cut into a different cutting length with two cutting blades, the pair of cutting blade elevating bodies can be arranged close to each other and the device can be downsized, and the cutting blades can be easily replaced and, further, the sheet cutter can be sufficiently operated by only one cutting blade elevating device. Therefore, the structure can be made simple.

Through-holes are provided in both the elevation driving body and the pair of cutting blade elevating bodies, and a transmission change-over device is composed in such a manner that the pin change-over moving device selectively moves the connecting pin, which is inserted into these through-holes, between a bridge state, in which the connecting pin acts as a bridge between the through-hole of the elevation driving body and the through-hole of one of the cutting blade elevating bodies, and no bridge state in which the connecting pin does not act as a bridge between the through-hole of the elevation driving body and the through-hole of one of the cutting blade elevating bodies. Therefore, the connection of the elevation driving body with the pair of cutting blade elevating body can be accurately and positively changed over by a simple structure.

A pair of through-holes are provided in the elevation driving body. On both sides of the elevation driving body, the holding member is stationarily arranged, and the corresponding cutting blade elevating body is partially inserted into between them. Through-holes opposed to the corresponding through-holes of the elevation driving body are provided in the holding member and the cutting blade elevating body. The connecting pin inserted into the through-holes can be selectively moved, by the pin change-over device between a position of bridge in which the connecting pin acts as a bridge between the through-hole of the elevation driving body and the through-hole of the cutting blade elevating body and a position of bridge in which the connecting pin acts as a bridge between the through-hole of the holding member and the through-hole of the cutting blade elevating body. In this way, the transmission change-over device is composed. Therefore, the cutting blade elevating body released from the connection with the elevation driving body can be positively held at the up position by a simple structure. Accordingly, the change-over motion to change over the connection can be positively conducted.

Further, a pushing pawl capable of pushing upward one of the cutting blade elevating body and the elevation driving body under the condition that both are connected to each other is provided in the other of the cutting blade elevating body and the elevation driving body, and a contacting member capable of releasing the pushing action by the pushing pawl at a up position of the elevation driving body is provided. Therefore, it is possible to eliminate a gap in the vertical direction in the connecting section between the cutting blade elevating body and the elevation driving body in the state of connection. Therefore, a lowering position of the cutting blade elevating body can be highly accurately positioned, and half-cutting can be highly accurately conducted on a sheet. Further, the connection with one of the cutting blade elevating bodies and the elevation driving body can be smoothly changed over.

Further, the elevation of the cutting blade elevating body is guided on both sides of the cutting blade elevating body by the guide member. Therefore, the distance between the cutting blade and the guide member can be reduced, and it is possible to decrease a deformation and inclination of the cutting blade. Accordingly, it is possible to highly accurately cut a sheet at high speed.

The invention claimed is:

1. A sheet cutter for cutting a sheet with a cutting blade held by a cutting blade elevating body which is elevated by one servo motor, comprising:
a pair of cutting blade elevating bodies; an elevation driving body for elevating the pair of cutting blade elevating bodies; a guide member for guiding the elevation of the pair of cutting blade elevating bodies; a holding body capable of holding the pair of cutting blade elevating bodies at an up position; and a transmission change-over device for selectively engaging the pair of cutting blade elevating bodies with the elevation driving body and selectively disengaging the pair of cutting blade elevating bodies from the elevation driving body,
wherein one of the pair of cutting blade elevating bodies, which has been selected, is elevated by the servo motor, and
wherein the transmission change-over device comprises through-holes communicating with each other in the horizontal direction at an up position of the cutting blade elevating body that are formed in both the elevation driving body and the pair of cutting blade elevating bodies, a connecting pin to be inserted into the through-holes and a pin change-over moving device for selectively moving the connecting pin between a position where the connecting pin is inserted into the through-hole of the elevation driving body and into the through-hole of one of the cutting blade elevating bodies and a position where the connecting pin is inserted into the through-holes of the elevation driving body and not inserted into the through-holes of one of the cutting blade elevating bodies.

2. The sheet cutter according to claim 1, wherein each of the cutting blade elevating bodies includes a pushing pawl capable of pushing the elevation driving body downward, and wherein the sheet cutter includes a contacting member capable of releasing the pushing action of the pushing pawl when the one of the cutting blade elevating bodies is moved to an up position.

* * * * *